(12) United States Patent
Preuschl et al.

(10) Patent No.: US 8,502,262 B2
(45) Date of Patent: Aug. 6, 2013

(54) LUMINOUS DEVICE HAVING A FLEXIBLE PRINTED CIRCUIT BOARD

(75) Inventors: Thomas Preuschl, Sinzing (DE);
Steffen Strauss, Regensburg (DE);
Florian Zeus, Zeitlarn (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 13/383,154

(22) PCT Filed: Jun. 16, 2010

(86) PCT No.: PCT/EP2010/058488
§ 371 (c)(1),
(2), (4) Date: Jan. 9, 2010

(87) PCT Pub. No.: WO2011/003713
PCT Pub. Date: Jan. 13, 2011

(65) Prior Publication Data
US 2012/0112235 A1    May 10, 2012

(30) Foreign Application Priority Data
Jul. 9, 2009    (DE) .......................... 10 2009 032 424

(51) Int. Cl.
*H01L 33/58*    (2010.01)
(52) U.S. Cl.
USPC .. 257/99; 257/E33.066; 257/98; 257/E23.065

(58) Field of Classification Search
USPC ....... 257/99, E33.066, 88, E23.065, E23.169, 257/E33.057, E33.059, 100, 773, 98; 438/26, 438/28
See application file for complete search history.

(56) References Cited

U.S. PATENT DOCUMENTS

| 4,761,720 | A | 8/1988 | Solow |
| 5,559,681 | A | 9/1996 | Duarte |
| 6,188,527 | B1 * | 2/2001 | Bohn ............................ 359/710 |

FOREIGN PATENT DOCUMENTS
EP    0 760 448    3/1997

\* cited by examiner

*Primary Examiner* — Zandra V. Smith
*Assistant Examiner* — Paul Patton
(74) *Attorney, Agent, or Firm* — Cozen O'Connor

(57) ABSTRACT

A lighting device (1;15) comprising at least one flexible printed circuit board (3) which is populated with at least one semiconductor light source, comprising a potting material overlaid on at least one populated side of the printed circuit board so as to leave at least one emission surface of the semiconductor light source (2) exposed; an adhesive element at least partially covering a top side of the semiconductor light source, wherein the adhesive element (7) protrudes partially from the potting compound (10), is enclosed around its sides by the potting compound (10) in an adhesive manner and has better adhesion to the potting compound (10) than does the semiconductor light source.

15 Claims, 2 Drawing Sheets

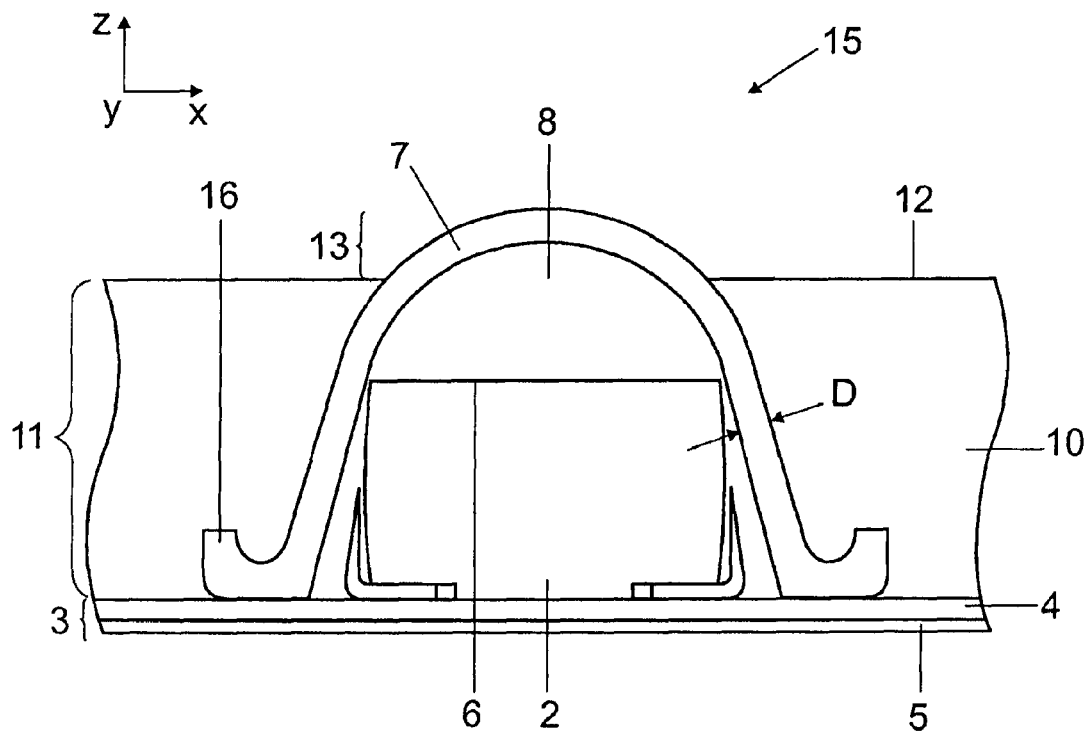
FIG 2
FIG 3
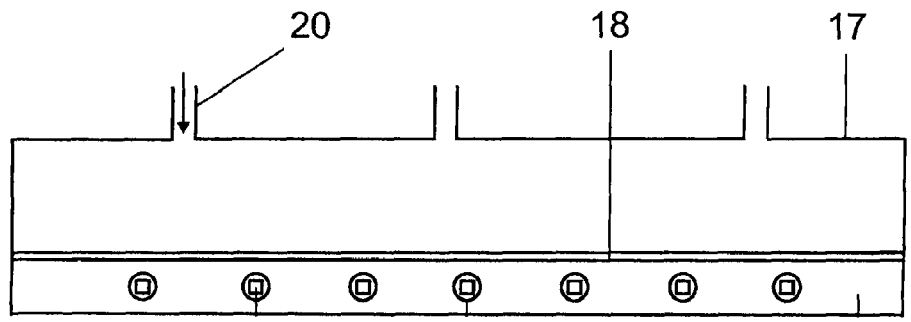

LUMINOUS DEVICE HAVING A FLEXIBLE PRINTED CIRCUIT BOARD

RELATED APPLICATIONS

This is a U.S. national stage of application No. PCT/EP2010/058488, filed on Jun. 16, 2010.

This application claims the priority of German application no. 10 2009 032 424.0 filed Jul. 9, 2009, the entire content of which is hereby incorporated by reference.

FIELD OF THE INVENTION

The invention relates to a lighting device having at least one flexible printed circuit board and to a method for fabricating a lighting device of said type.

BACKGROUND OF THE INVENTION

Flexible printed circuit boards ("flexible strips") populated with light-emitting diodes and totally encapsulated in potting compound by insert molding for IP protection purposes are well-known. Emission efficiency is lost in these devices, however, because of significant light losses in the potting compound. In order to avoid degrading the emission efficiency, an alternative option is known in which the potting compound does not extend over the top edge of the LED(s), and therefore the LED(s) together with the typical uppermost light-emitting surface thereof is (are) no longer covered by the potting compound. With this alternative there is on the other hand a risk that when bending occurs cracks will form between the potting compound and the housing side of the LED, which can result in breaks in the seal and ingress of moisture, dust, etc. into the flexible strip.

SUMMARY OF THE INVENTION

One object of the present invention is to provide a lighting device having a flexible printed circuit board that manifests no significant reduction in emission efficiency while affording a high level of IP protection (high IP protection class).

This and other objects are attained in accordance with one aspect of the present invention directed to a lighting device that comprises at least one flexible printed circuit board ("flexible strip") which is populated with at least one semiconductor light source, wherein at least one populated side of the printed circuit board is overlaid by a potting material which leaves at least one emission surface of the semiconductor light source exposed, and wherein the semiconductor light source is covered at least partially by an adhesive element, wherein the adhesive element (i) protrudes partially from the potting compound, (ii) is enclosed around its sides by the potting compound in an adhesive manner, and (iii) has better adhesion to the potting compound than does the semiconductor light source.

A possible example of the populated flexible strip can be a flexible strip in the LINEARLight series from the company OSRAM.

In principle there is no restriction on the type of semiconductor light source, although an LED or a laser diode is preferred as the emitter. The semiconductor light source can comprise one or more semiconductor emitters. The semiconductor emitter(s) can be mounted on a carrier on which further electronic components such as resistors, capacitors, logic chips, etc. can also be mounted. The semiconductor emitters can be mounted on the printed circuit board by conventional solder techniques, for example. Alternatively, the semiconductor emitters can also be connected to a substrate ("submount") by means of chip-level connection methods, such as bonding (wire bonding, flip-chip bonding), etc., e.g. by populating a substrate made of AlN with LED chips. In addition, one or more submounts can be mounted on a printed circuit board.

When a plurality of semiconductor emitters are present, they can emit in the same color, e.g. white, making it easy to scale the light intensity. At least some of the semiconductor emitters, however, may also have a different emission color, e.g. red (R), green (G), blue (B), amber (A) and/or white (W). It is thereby possible, where appropriate, to tune an emission color of the light source, and to adjust the color to any color point. In particular it may be preferred if semiconductor emitters of different emission color can produce a white mixed light. Instead of, or in addition to, inorganic light-emitting diodes, e.g. based on InGaN or AlInGaP, organic LEDs (OLEDs) can also be used generally. In addition, it is possible to use diode lasers, for instance.

The fact that the adhesive element protrudes out of the potting compound means that it lies partially underneath a surface of the potting compound, and hence is embedded by said part in the potting compound, and lies partially above the surface of the potting compound. The part lying underneath the surface of the potting compound is hence enclosed by the potting compound, at least around the sides. Since the adhesive element covers the semiconductor light source at least partially, the semiconductor light source can therefore lie underneath the surface of the potting compound; in other words, the potting compound can thus extend upward above the semiconductor light source.

Owing to the fact that the adhesive element has better adhesion than the semiconductor light source to the potting compound, crack formation at the interface between potting compound and adhesive element can be suppressed compared with adhesion between potting compound and light-emitting element, whereby reliable IP protection can be maintained even under more severe bending, and moreover this can be achieved without the potting compound impairing the lighting efficiency.

Advantageously, the adhesive element can completely cover a top side of the respective semiconductor light source. This results in particularly low deformation of the adhesive element under flexural stress. In addition, as discussed later, the adhesive element can be embodied so as to guide light. Furthermore, it is then particularly easy to handle.

Alternatively, however, use can also be advantageously made of an adhesive element that does not completely cover the top side of the respective semiconductor light source, e.g. an annular adhesive element. An adhesive element of said type has the advantage that it can enclose the light-emitting surface of the semiconductor light-emitting element on the outside, leaving the light-emitting surface exposed, so that while there continues to be improved adhesion on the surface of the potting compound only between the adhesive element and the potting compound, there is also no light absorption by a material covering the semiconductor light source.

The adhesive element can advantageously have a lateral protrusion that is covered by the potting compound. This improves the adhesion to the potting compound because of a larger common interface. In addition, it makes the adhesive element easier to handle.

The adhesive element can advantageously cover the sides of the respective semiconductor light source at least partially with respect to the potting compound. This can further improve adhesion in depth regions, thereby hindering, when there are already existing superficial cracks, crack propagation depthwise along the interface with the potting compound.

A wall thickness of a region of the adhesive element covering the sides of the respective semiconductor light source can advantageously equal 0.2 mm to 1 mm in most places.

In order to prevent crack propagation as far as the printed circuit board, it can be particularly advantageous if the adhesive element completely covers the sides of the respective semiconductor light source. Furthermore, this can also protect the semiconductor light source from the liquid potting material during the encapsulation process, in particular if the potting material is a hot melt adhesive.

In order to stop crack propagation depthwise along the interface between adhesive element and potting compound, it can be particularly advantageous if the adhesive element has a circumferential protrusion or collar that is bent upward ("hat rim"). A crack tip can then be stopped by the collar, so that a major obstacle can be provided to prevent the potting compound detaching from the printed circuit board. In addition, a good, form-fit join is produced between the adhesive element and the potting compound.

In addition, said collar can advantageously be provided at a lower edge of the adhesive element for simpler fabrication.

In order to achieve a compact design and a particularly low light loss, it can be advantageous if the adhesive element includes an optical element, in particular a lens, which is located downstream of the semiconductor light source in the optical path. The optical element can be used, for example, for beam guidance or for protection (protective lens, cover lens). The optical element can cover in particular the light emission surface(s) of the semiconductor light source. The optical element can advantageously be an integral or single-piece component of the adhesive element.

Advantageously, the adhesive element or, as a part thereof, the optical element can be connected to the semiconductor light source by means of an index-matching material, because this can reduce Fresnel reflection at the surface of the optical element.

Advantageously, a material of the adhesive element or, as a part thereof, of the optical element, can include Makrolon, silicone and/or glass. Makrolon is the trade name for a polycarbonate developed by Bayer AG, Germany, which is transparent (and which can be colored), has very high breaking strength, is very lightweight and also has a high degree of dimensional stability even at high temperatures. Combinations of materials are also possible, e.g. providing a glass lens under a Makrolon film. The aforementioned materials adhere particularly well to a potting compound made of what is known as hot melt adhesive. In particular, the material of the adhesive element or of the optical element has a lower light absorption than the potting compound.

The potting compound can advantageously include a hot melt adhesive (also known as hot glue), in particular can be made entirely thereof, because particularly easy and low-cost fabrication can be achieved by this means.

The method is used to fabricate a lighting device and comprises at least the following steps: pressing together at least one adhesive element and a respective semiconductor light source attached to the printed circuit board; and encapsulation of the populated printed circuit board and the at least one adhesive element.

It can be advantageous if these steps are preceded by a step of inserting at least one adhesive element into a tool.

However, it can also be advantageous if these steps are preceded by, or performed simultaneously with, a step of placing at least one adhesive element onto an associated semiconductor light source.

BRIEF DESCRIPTION OF THE DRAWINGS

The invention is described in more detail in the following figures with reference to schematic diagrams of exemplary embodiments. For clarity of illustration reasons, identical elements or elements having an identical effect may be labeled with the same reference signs in the figures.

FIG. 2 shows as a cross-sectional diagram a side view of a segment of a lighting device according to a second embodiment variant;

FIG. 3 shows a plan view of a tool for fabricating a lighting device.

DETAILED DESCRIPTION OF THE DRAWINGS

Figure 1:
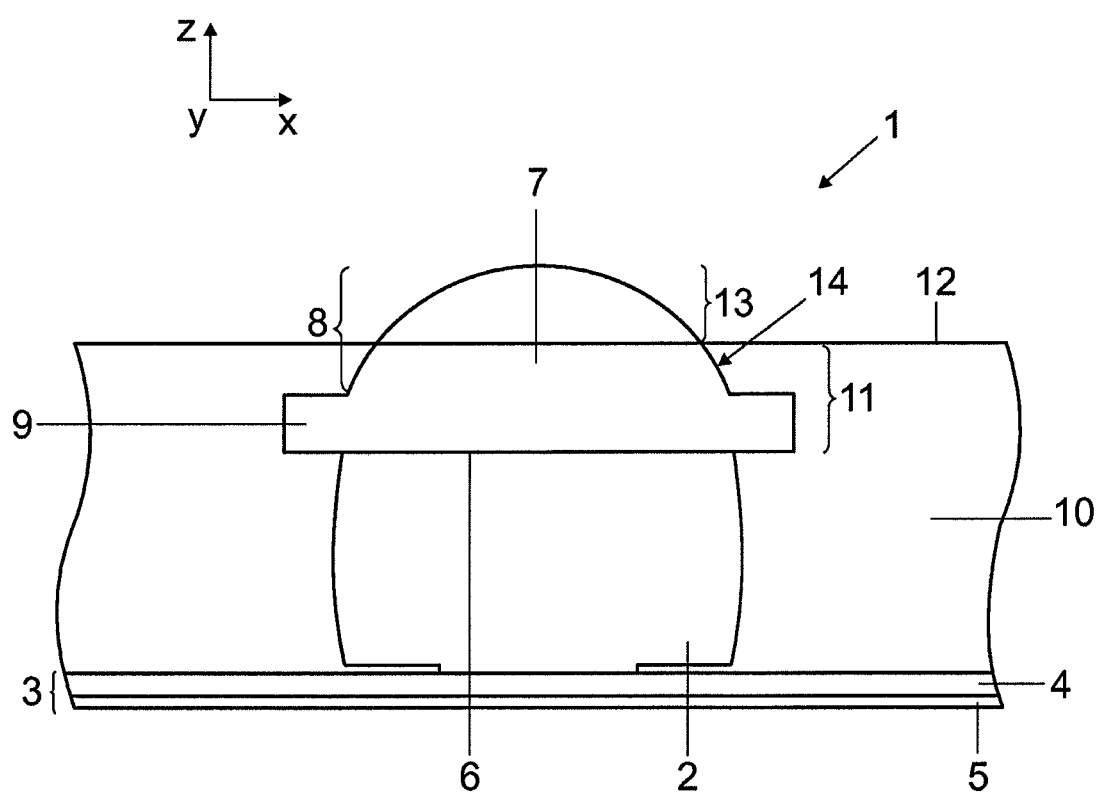
FIG. 1 shows as a cross-sectional diagram a side view of a segment of a lighting device according to a first embodiment variant.

FIG. 1 shows as a cross-sectional diagram a side view of a lighting device 1 according to a first embodiment variant in the region of a semiconductor light source in the form of a light-emitting diode 2. The light-emitting diode 2 is attached on the underside to a strip-shaped flexible printed circuit board ("flexible strip") 3 and emits radiation mainly upward (along the z-axis). The flexible strip 3 is populated on one side and comprises a base layer 4 made of a flexible insulating printed circuit board material, e.g. polyimide. The flexible strip 3 is overlaid on its underside by an interconnection layer 5 in the form of a copper cladding for the purpose of electrical interconnection of the light-emitting diode 2 and, where applicable, other electronic components. A top side 6 of the light-emitting diode 2, which also includes the light-emitting surface, is covered completely over its surface by an adhesive element 7. The adhesive element 7 protrudes laterally (in an (x,y) plane orthogonal to the z-axis) around the circumference beyond the light-emitting diode 2. More precisely, the adhesive element 7 comprises a lens-shaped part or an integral lens 8 and a circumferential collar-shaped part or collar 9. The populated side of the flexible strip 3 is encapsulated by a potting compound 10 in the form of a hot melt adhesive in such a way that the light-emitting diode 2 and a (lower) part 11 of the adhesive element 7 are embedded in the potting compound 10. In other words, an exposed surface 12 of the potting compound 10 stands higher than the top surface 6 of the light-emitting diode and higher than an embedded part 11 of the adhesive element 7. Consequently, an (upper) part 13 of the adhesive element 7 protrudes out of the potting compound 10.

By means of the lens 8, light emerging upward from the surface 6 of the light-emitting diode 2 is guided by the lens-shaped part 8 of the adhesive element 7 substantially into the upper part 13 of the adhesive element 7, and onward from there to the outside, with negligible light absorption in the adhesive element 7. The collar 9 performs two functions: firstly it creates a relatively large interface or contact surface between the adhesive element 7 and the potting compound 10, which improves adhesion; secondly, the potting compound located above the collar prevents the adhesive element 7 from detaching or lifting off from the light-emitting diode 2. In order to ensure that the adhesive element 7 is joined to the light-emitting diode 2 over a large surface area, the adhesive element 7 is joined via a layer of index-matching material (not shown).

If the lighting device 1 is bent along its length (along the x-axis), tensile stresses form on the top surface, which can result in crack formation. In this case, because the potting compound 10 is relatively insusceptible to cracks, a crack will preferentially form at an interface 14 between the potting compound 10 and the adhesive element 7. Since, however, the adhesion between the adhesive element 7 and the potting compound 10 is better than between the light-emitting diode 2 and the potting compound 10 in a similar construction, crack formation and hence damage to the lighting device 1 can be suppressed. Thus, a higher level of IP protection can be achieved overall without a substantial reduction in the emission efficiency.

FIG. 2 shows as a cross-sectional diagram a side view of a segment of a lighting device 15 according to a second embodiment variant. Unlike the first embodiment variant shown in FIG. 1, the adhesive element 7 is now embodied in a bell shape, i.e. it broadens from the top down toward the flexible strip 3, and completely covers the top and sides of the light-emitting diode 2 and thereby fully shields the light-emitting diode from the potting compound 10. Firstly this achieves particularly strong adhesion, and hence suppression of crack formation, and secondly can also reduce thermal stress on the light-emitting diode 2 during a hot encapsulation process. The adhesive element 7 once again has a lens-shaped part 8 which outputs the light emitted by a top side of the LED 2 to the outside without, or largely without, the light passing through the potting compound 10. At its lower edge the adhesive element 7 has a turned-up collar 16 which rests on the flexible strip 3. The collar 16 performs two functions: firstly it can stop a crack propagating along the interface between the adhesive element 7 and the potting compound 10 from reaching the flexible strip 3, and secondly it can achieve a good form-fit for the join between the adhesive element 7 and the potting compound 10. The adhesive element 7 is implemented as a single-piece glass body.

The lens 8 can be made of the same material as the rest of the adhesive element 7, i.e. the adhesive element 7 can in particular be made of a single material or composite material, or the lens can be made as a volume from a volume of material that differs from the rest of the adhesive element 7, i.e. the adhesive element 7 can in particular be made of different material components. A wall thickness d of the adhesive element 7 around the sides of the light-emitting diode 2 in a different region from the collar 16 in this case equals 0.2 mm to 1 mm.

FIG. 3 shows a plan view of a tool 17 for fabricating a lighting device, which is explained here by way of example with reference to the lighting device of FIG. 1. The tool 17 has a channel 18 for inserting the lighting strip 3. Recesses 19 are incorporated into the channel 18, into which recesses the adhesive element 7 can be inserted by that (upper) part that is intended to protrude above the potting compound. In order to fabricate the lighting device, a flexible strip 3 populated with LEDs 2 is inserted upside down, i.e. with the side populated with the LEDs 2 facing toward the workpiece 17, in the channel 18 in such a way that the LEDs 2 come to lie on the adhesive element 7. Subsequently, the warm hot melt adhesive is conducted via injection molding domes 20 to the channel 18, as indicated by the arrow. After cooling of the hot melt adhesive, the lighting device is detached from the tool 17.

Alternatively, the adhesive elements can also be placed directly onto the populated flexible strip, which has the advantage that the flexible strip 3 does not need to be turned over.

The present invention is obviously not restricted to the exemplary embodiments shown. For instance, printed circuit boards populated with light sources on both sides can also be processed further to form lighting devices that emit light on both sides.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A lighting device comprising at least one flexible printed circuit board which is populated with at least one semiconductor light source, comprising:
    a potting material overlaid on at least one populated side of the printed circuit board so as to leave at least one emission surface of the semiconductor light source exposed; and
    an adhesive element at least partially covering a top side of the semiconductor light source, wherein the adhesive element protrudes partially from the potting compound, is enclosed around its sides by the potting compound in an adhesive manner and has better adhesion to the potting compound than does the semiconductor light source.

2. The lighting device as claimed in claim 1, wherein the adhesive element completely covers a top side of the respective semiconductor light source.

3. The lighting device as claimed in claim 1, wherein the adhesive element has a lateral protrusion that is covered by the potting compound.

4. The lighting device as claimed in claim 1, wherein the adhesive element covers the sides of the respective semiconductor light source at least partially with respect to the potting compound.

5. The lighting device as claimed in claim 3, wherein the adhesive element has a circumferential protrusion that is bent upward.

6. The lighting device as claimed in claim 4, wherein a wall thickness of a region of the adhesive element covering the sides of the respective semiconductor light source equals 0.2 mm to 1 mm at least in most places.

7. The lighting device as claimed in claim 1, wherein the adhesive element includes an optical element, which is located downstream of the semiconductor light source in the optical path.

8. The lighting device as claimed in claim 7, wherein the optical element is connected to the semiconductor light source by an index-matching material.

9. The lighting device as claimed in claim 7, wherein a material of the optical element includes Makrolon, silicone and/or glass.

10. The lighting device as claimed in claim 1, wherein the potting compound includes a hot melt adhesive.

11. A method for fabricating a lighting device as claimed in claim 1, wherein the method comprises the steps of:
    pressing together at least one adhesive element and a respective semiconductor light source attached to the printed circuit board; and
    encapsulation of the populated printed circuit board and the at least one adhesive element.

12. The method as claimed in claim 11, which beforehand comprises the step of inserting at least one adhesive element into a tool.

13. The method as claimed in claim 11, which additionally comprises the step of placing at least one adhesive element onto an associated semiconductor light source.

14. The lighting device as claimed in claim 1, wherein the adhesive element completely covers the sides of the respective semiconductor light source with respect to the potting compound.

15. The lighting device as claimed in claim 7, wherein the optical element is a lens.

\* \* \* \* \*